United States Patent [19]

Shibata

[11] Patent Number: 5,757,082
[45] Date of Patent: May 26, 1998

[54] SEMICONDUCTOR CHIPS, DEVICES INCORPORATING SAME AND METHOD OF MAKING SAME

[75] Inventor: Kazutaka Shibata, Kyoto, Japan

[73] Assignee: Rohm Co., Ltd., Kyoto, Japan

[21] Appl. No.: 688,427

[22] Filed: Jul. 30, 1996

[30] Foreign Application Priority Data

Jul. 31, 1995 [JP] Japan ................ 7-194660

[51] Int. Cl.$^6$ ............ H01L 23/48; H01L 23/52; H01L 29/40; H01L 23/58
[52] U.S. Cl. .......... 257/786; 257/784; 257/690; 257/48
[58] Field of Search ............... 257/694, 784, 257/781, 697, 691, 690, 786, 48

[56] References Cited

U.S. PATENT DOCUMENTS

H1267  12/1993  Boyd ................... 257/666

FOREIGN PATENT DOCUMENTS 2-82644  3/1990  Japan ................ 257/788
6-53266  2/1994  Japan ................ 257/786

Primary Examiner—Mahshid D. Saadat
Assistant Examiner—Jhihan B. Clark
Attorney, Agent, or Firm—Keiichi Nishimura

[57] ABSTRACT

A rectangular semiconductor chip is bonded onto a rectangular island at the center of a frame having a plurality of inner leads extending radially from the center. The chip has a plurality of pads adapted to be connected by wire bonding to corresponding ones of the inner leads. The pads are disposed sequentially along at least one side of the rectangular chip. Separations between mutually adjacent pairs of these pads along the side of the chip are smaller in the center part than in the end parts of the side such that the pads can be disposed closer together while preventing interference between mutually adjacent pairs of the bonding wires.

2 Claims, 6 Drawing Sheets

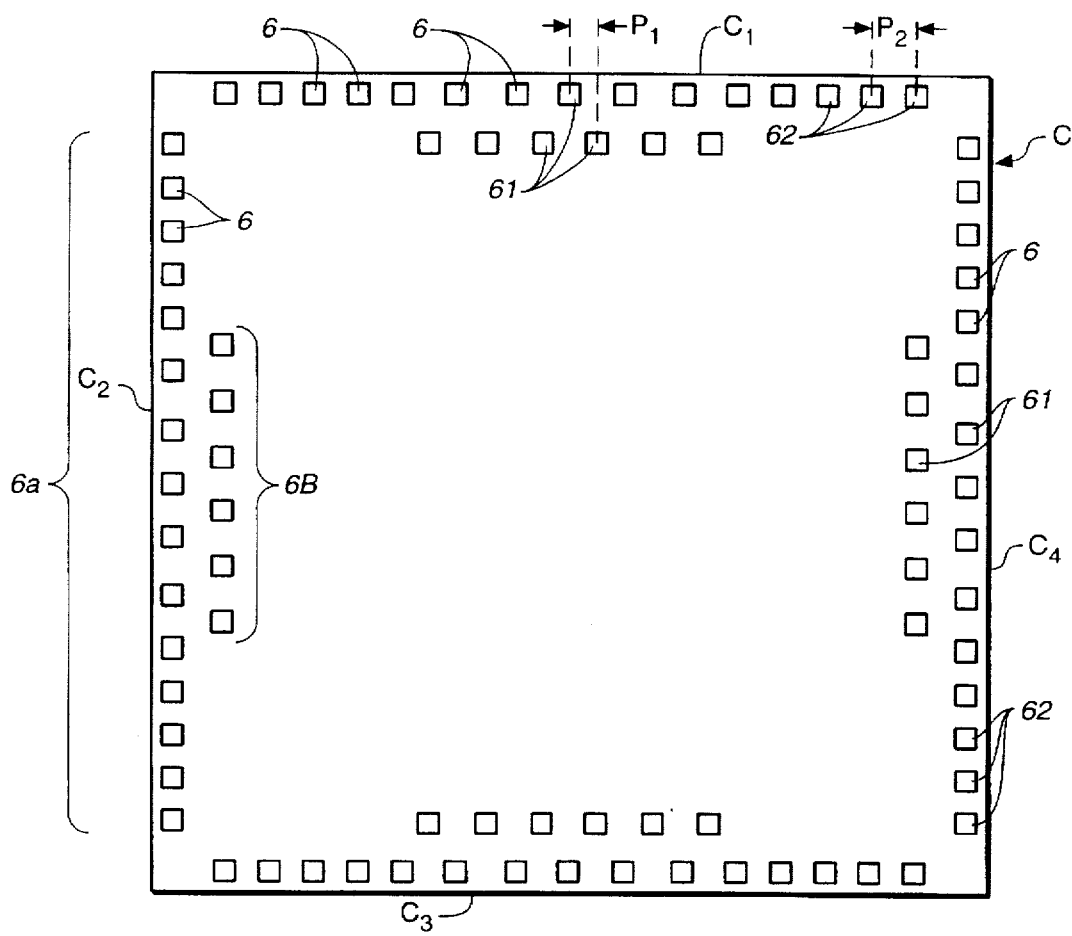
FIG._1

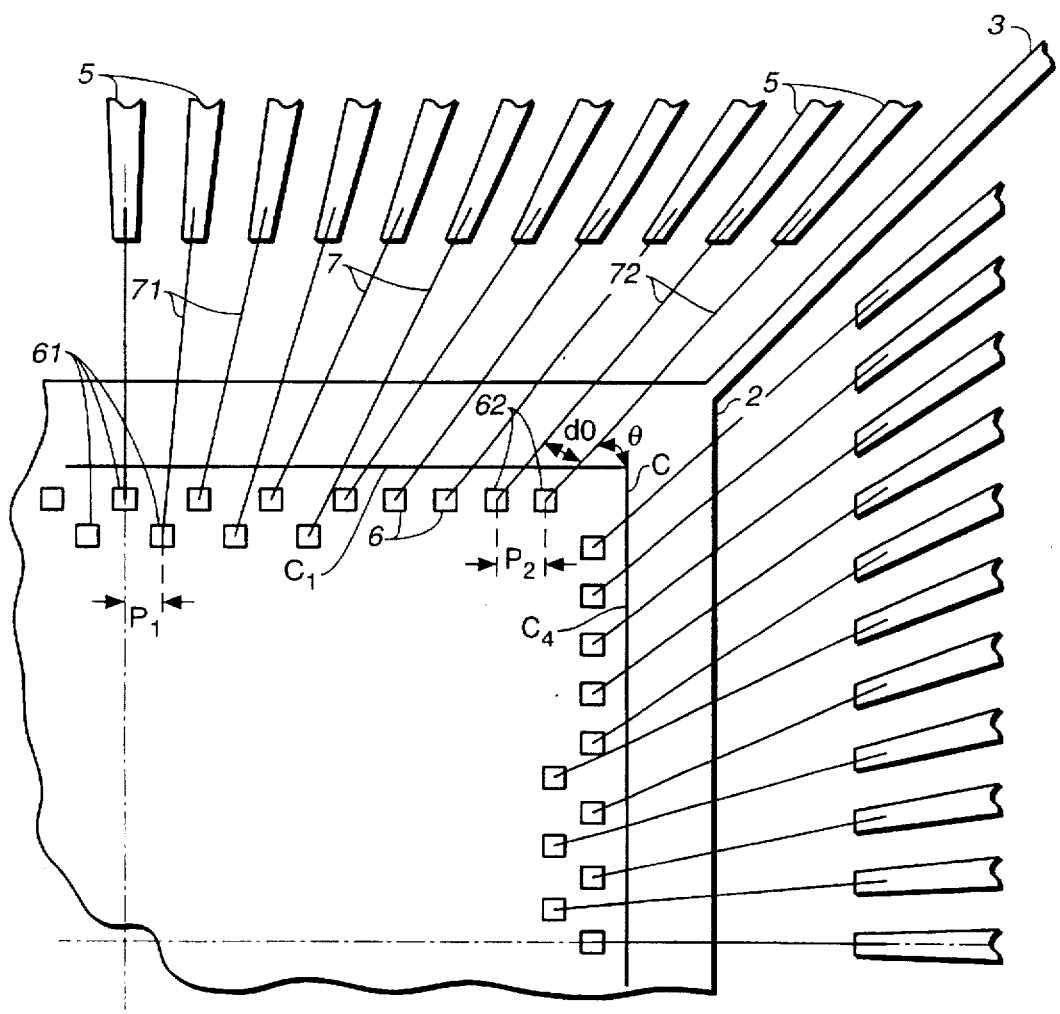
FIG._2

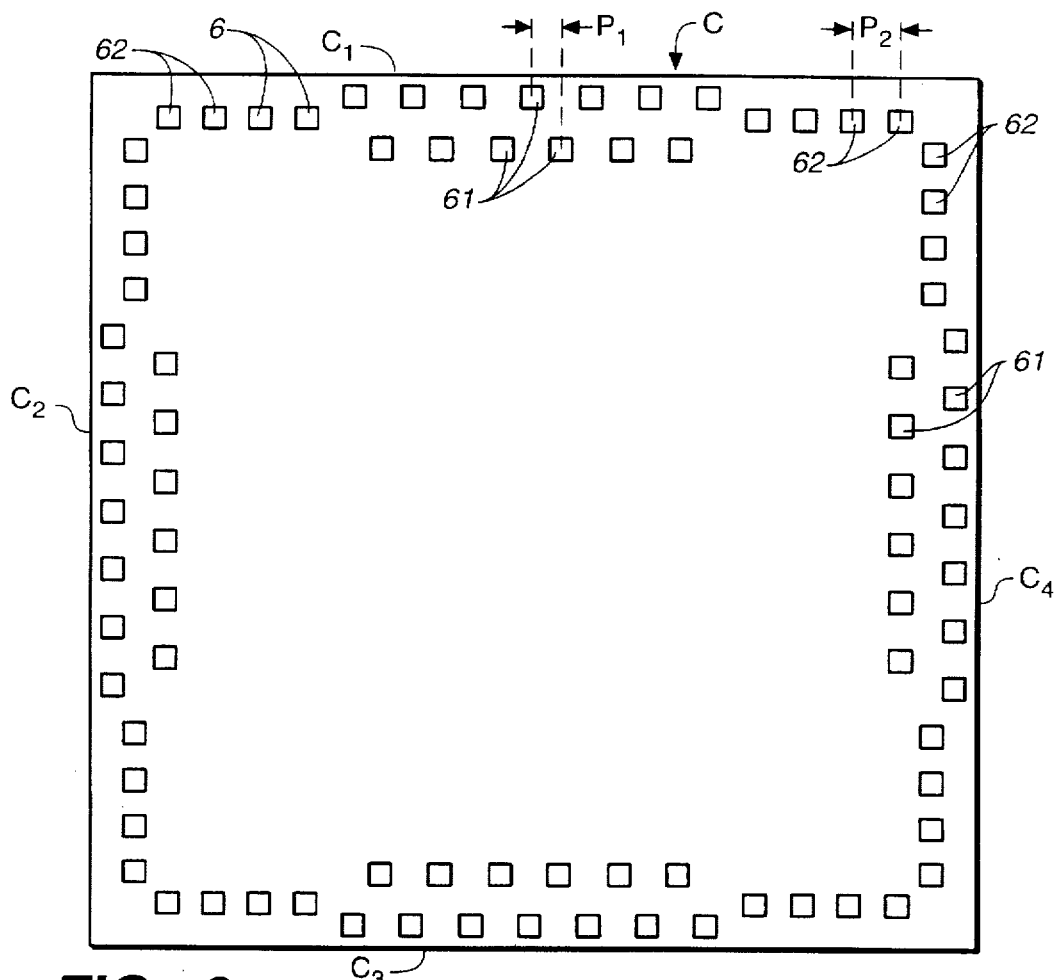
FIG._3
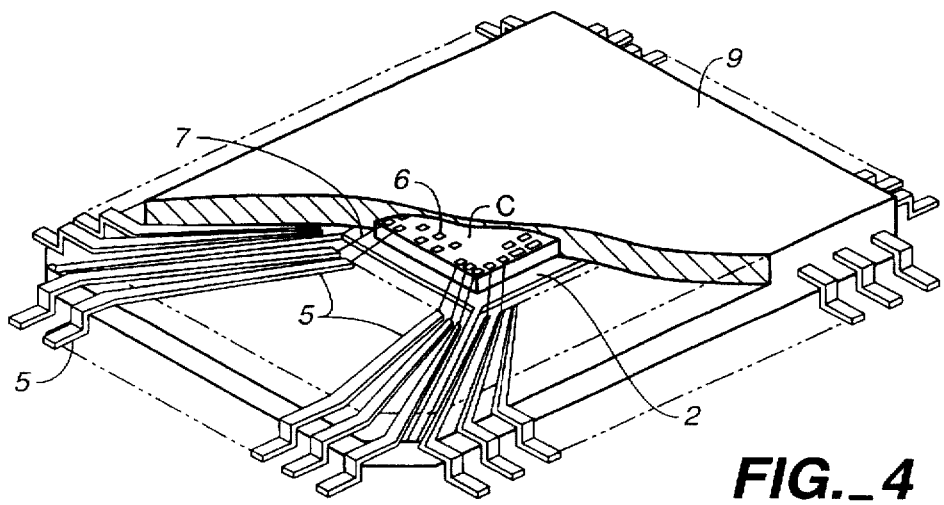
FIG._4

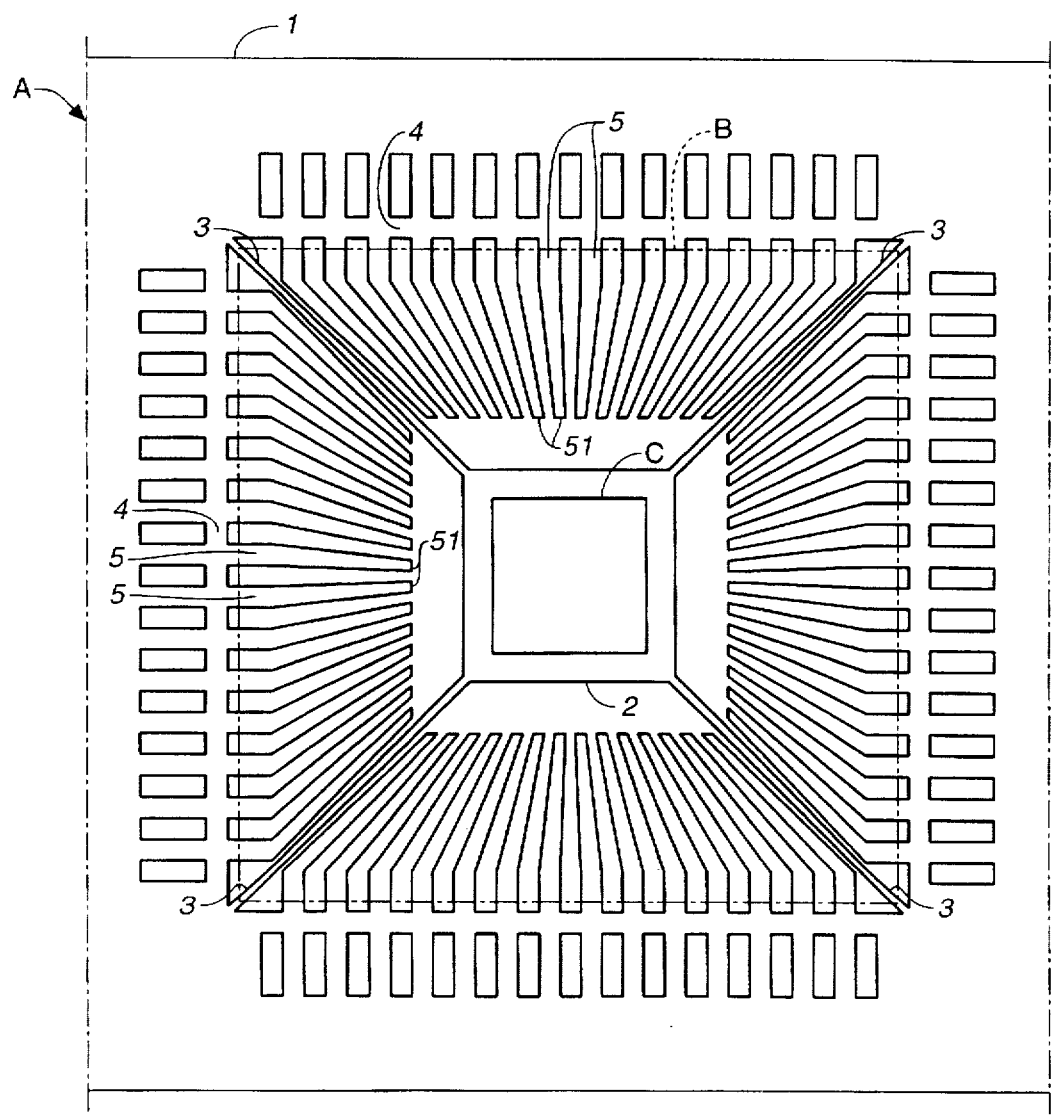
FIG._5
*(PRIOR ART)*

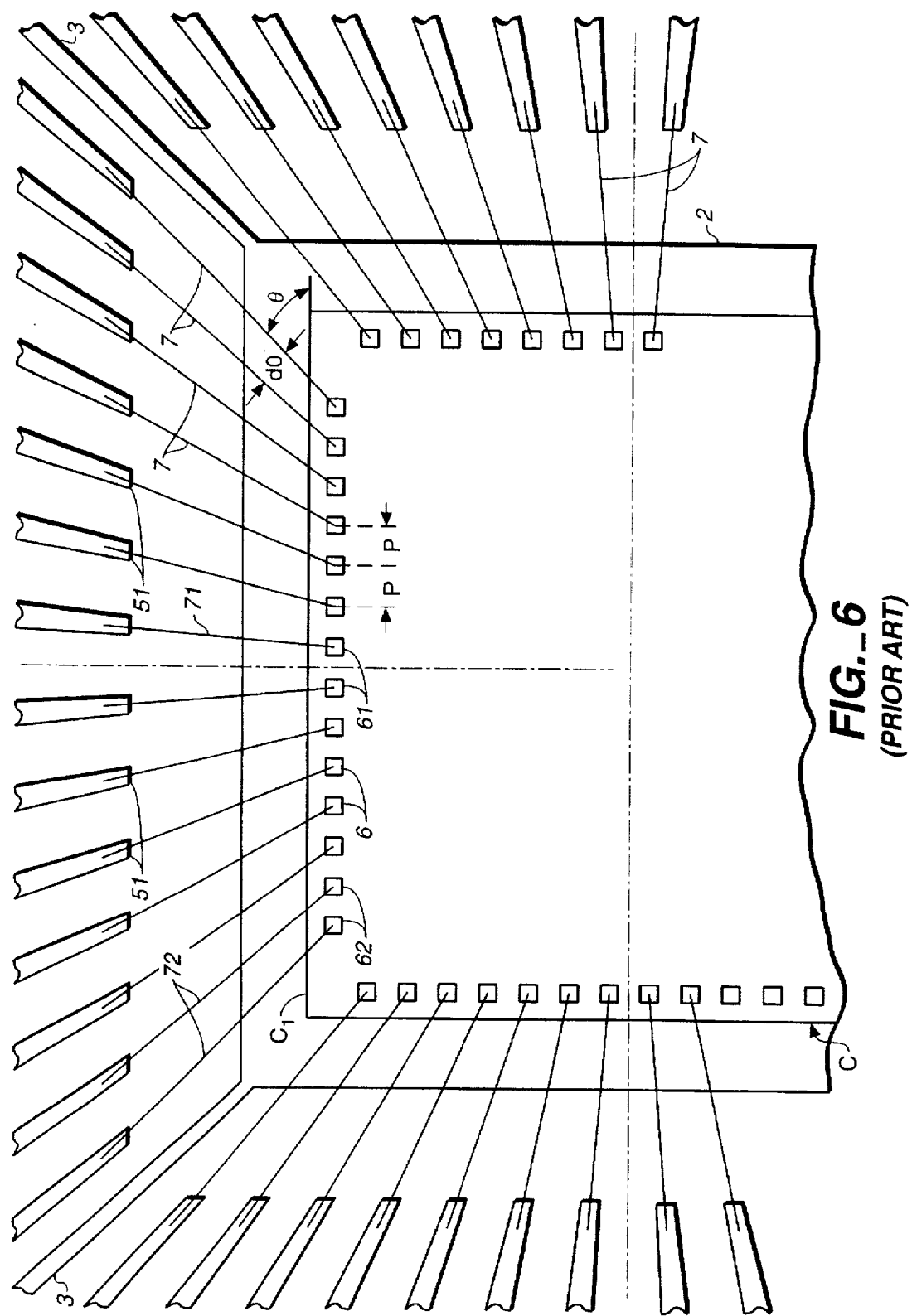
FIG._6 (PRIOR ART)

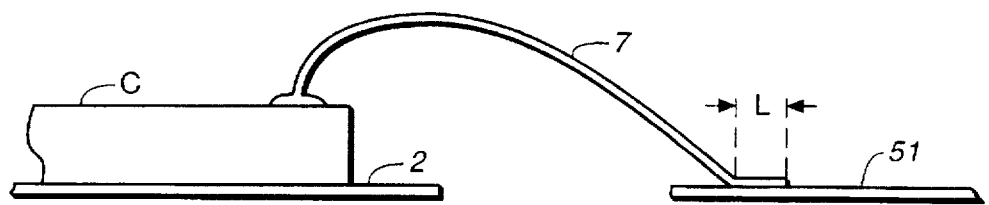
FIG._7
(PRIOR ART)
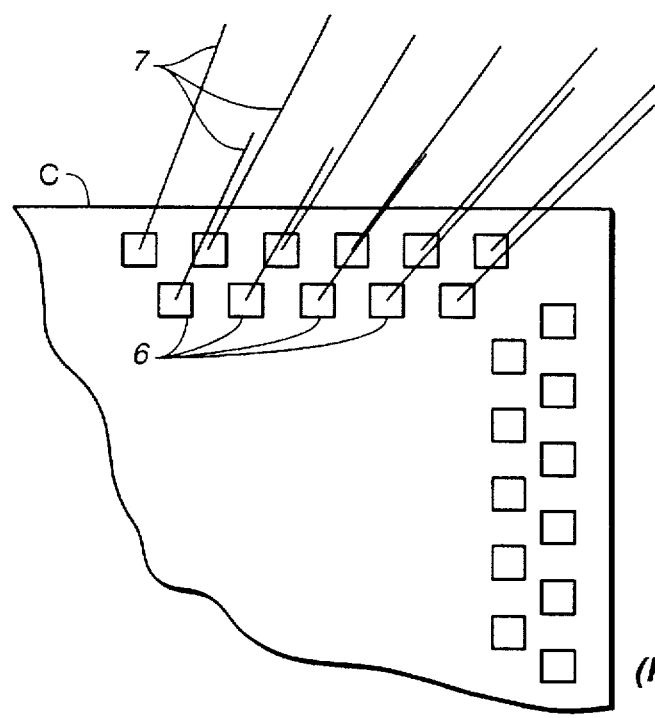
FIG._8
(PRIOR ART)
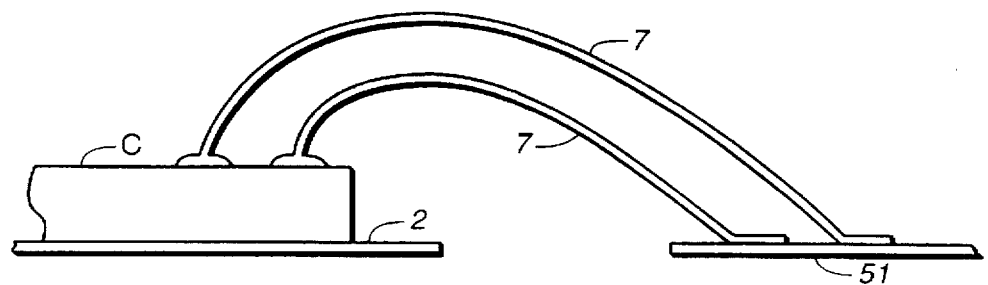
FIG._9
(PRIOR ART)

5,757,082

SEMICONDUCTOR CHIPS, DEVICES INCORPORATING SAME AND METHOD OF MAKING SAME

BACKGROUND OF THE INVENTION

This invention relates to semiconductor chips, devices incorporating such semiconductor chips and a method of producing such devices.

Many highly integrated resin-packaged semiconductor devices with a large number of external lead terminals are structured in a so-called quad-form, having many external terminals extended from the four sides of a resin package formed in a planar rectangular shape. FIGS. 5 and 6 show a prior art example of a frame 1 for producing such a quad-form semiconductor device with a semiconductor chip C bonded thereon. A rectangular region A is formed on the frame 1, and an island 2 which is also rectangular is formed at the center of this rectangular region A and is connected and supported by the frame 1 at the four corners of this region A through four suspension leads 3 extending radially from the four corners of the island 2. A plurality of lead lines 5, connected together by a tie bar 4, extend inward from each side of the rectangular region A towards the island 2, serving as inner leads 51 with a specified gap left between the inner end of each inner lead 51 and the corresponding outer edge of the island 2. The inner leads 51 are each so shaped that both the separation between each mutually adjacent pair of them and their own widths decrease towards the island 2 such that the inner leads 51 will appear, when seen as a whole, as if extending radially from the center of the island 2.

The semiconductor chip C to be bonded to the island 2 is also planar and rectangular in shape, a plurality of pads 6 for wire bonding being formed along each of its four sides on its upper surface and each connected to a corresponding one of the inner leads 51 by a wire bonding process with wires 7 also extended in the directions of the corresponding inner leads 51, that is, radially from the center of the semiconductor chip C. This is necessary because, when the wire 7 is thermally attached to the corresponding lead 51 by a second bonding process as shown in FIG. 7, a certain finite distance L is required in the direction of extension of the wire 7 for effecting bonding by thermal compression, and it is not feasible to carry out such a second bonding process in any direction transverse to the direction of extension of the inner lead 51 since the tips of the inner leads 51 are generally extremely narrow.

After so-called chip bonding and wire bonding are carried out on the frame 1, a resin mold package is formed for sealing the area shown by line B in FIG. 5. A quad-form semiconductor device is obtained thereafter through a tie bar cutting process whereby unwanted portions of the tie bars 4 are cut and a lead cutting process whereby outer leads are cut from the frame.

The wire bonding pads 6, according to prior art technology, are arranged on straight lines at a specified pitch P, as shown in FIG. 6, the pitch P being determined as follows. Consider, for example, those of the pads 6 on one of the sides of the semiconductor chip C. Although bonding wires 71 connected to the pads 61 near the center of the side cross the edge $C_1$ of the chip C nearly perpendicularly, bonding wires 72 connected to the pads 62 near either end of the side cross the edge $C_1$ at an angle (shown by θ) which is nearly equal to 45°. The pitch P is selected such that even the mutually adjacent pairs of the wires crossing the edge $C_1$ at such an angle (nearly equal to 45°) can be separated by a distance (shown by $d_0$ in FIG. 6) which is sufficiently large such that there will be no mutual interference therebetween. Moreover, the pads 6 on all four sides were separated at a constant pitch P on prior art chips. Thus, the dimensions of prior art chips were determined by the pitch P between the pads 6 for wire bonding and the number of pads 6 to be formed along each of its sides.

In order to improve the production yield and production efficiency of semiconductor chips, it is necessary to make chips as small as possible. As explained above, however, the chips could not be made smaller beyond a certain limit dictated in part by the pitch P of the pads for wire bonding. Although the progress in the art of integration is making it possible to reduce the circuit-forming area on a chip, the overall size of the chip could not be reduced beyond a certain limit where a given number of pads had to be provided at a required pitch. Although it has been known to arrange the pads 6 in two rows and in a mutually staggered way as in a zigzag, as shown in FIG. 8, and the interference between wires 7 bonded to pads 6 in different rows could be avoided by arranging them as shown in FIG. 9, interference between wires bonded to mutually adjacent pads in the same row could be avoided only by maintaining a certain pitch P between the pads 6.

SUMMARY OF THE INVENTION

It is therefore an object of this invention to provide a semiconductor chip with wire bonding pads arranged such that its overall size can be reduced.

A semiconductor chip according to this invention, with which the above and other objects can be accomplished, may be characterized as comprising a planar rectangular surface and a plurality of pads for wire bonding arranged sequentially thereon along at least one of its sides such that separations between mutually adjacent pairs of the pads (measured in the direction of this side) are smaller towards the center part than in the end parts of the side. Such a chip is bonded to the so-called island, which is a rectangular central portion, of a frame having inner leads extending radially therefrom, and the pads are each connected by wire bonding to a corresponding one of the inner leads. Since these bonding wires extend also radially from the rectangularly shaped chip at the center, care is taken according to this invention such that mutually adjacent bonding wires extending from pads on an end part along any side should not be too close to each other because they make an angle of nearly 45° with the side of the chip and the separations between them become much smaller than those between the corresponding pads to which they are connected if these pads are arranged on a straight line. Those of the bonding wires connected to pads near the center of a side of the chip, on the other hand, extend nearly perpendicularly to the side and hence the pads around the center of the side can be more densely distributed therealong. The present invention is based on this observation.

The pads for wire bonding must have a certain minimum size in order to allow wires to be bonded correctly thereto in the so-called first bonding process. In other words, the separation between two mutually adjacent pads in the direction of the side of the chip cannot be reduced beyond a certain limit if these pads are to be disposed on a single straight line. According to this invention, the pads are disposed in two rows over the center part of each side such that their mutual separations in the direction of the side of the chip are reduced.

According to this invention, therefore, the pads can be arranged closer together than on prior art semiconductor chips while preventing interference between mutually adjacent pairs of bonding wires. As a result, semiconductor chips according to this invention, and hence also the semiconductor devices incorporating them, can be made more compact without adversely affecting their performance characteristics.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a plan view of a semiconductor chip embodying this invention;

FIG. 2 is a plan view of a portion of the semiconductor chip of FIG. 1 after it has been bonded to a frame and wire bonding has been carried out;

FIG. 3 is a plan view of another semiconductor chip embodying this invention;

FIG. 4 is a partially cut diagonal view of a resin-packaged semiconductor device embodying this invention;

FIG. 5 is a plan view of a portion of a frame for producing prior art quad-form semiconductor devices;

FIG. 6 is an enlarged plan view of a portion of the frame of FIG. 5 with a prior art semiconductor chip bonded and wire bonding effected thereon;

FIG. 7 is a side view of a portion of the frame and the semiconductor chip bonded thereon shown in FIG. 6;

FIG. 8 is a plan view of a portion of another prior art semiconductor chip after wire bonding has been effected; and FIG. 9 is a side view of the semiconductor chip of FIG. 8.

Throughout herein those components which are identical or at least substantially equivalent are indicated by the same numerals and their descriptions are not necessarily repeated.

DETAILED DESCRIPTION OF THE INVENTION

The invention is described next by way of examples with reference to FIGS. 1, 2, 3 and 4 wherein those components which are identical or at least substantially equivalent are indicated by the same numerals for the convenience of description, independent of whether they belong to a chip/device according to this invention or according to prior art.

FIG. 1 shows a semiconductor chip C according to this invention, which is planar and rectangular. Such a chip may be produced by processing wafers in known manners to incorporate desired circuits and/or elements and dividing them into unit chips by dicing. The semiconductor chip C of FIG. 1 is used for producing a resin-packaged device of a quad-form type such as an LSI or a gate array, having pads 6 for wire bonding provided along its four sides $C_1$, $C_2$, $C_3$ and $C_4$. According to this invention, the separations $P_1$ between mutually adjacent pairs of pads 61 (or "the center pads") near the center of each of the sides of the chip C (or "the center part") are made smaller than the separations $P_2$ between mutually adjacent pairs of pads 62 (or "the end pads") near an end of a side of the chip C (or "the end part"). Throughout herein, as shown in FIGS. 1 and 2, for example, "separation" between mutually adjacent pads shall mean their separation as measured in the direction of the side along which they are disposed, not their center-to-center distance.

According to the embodiment shown in FIG. 1, the pads 6 are arranged in two rows along each of the sides of the chip C. The pads 6a in the first row closer to the corresponding edge are distributed along nearly the entire length of the side, and the pads 6b in the second row closer to the center of the chip C are distributed over only a shorter distance near the center of the side (that is, only within the center part). Within the center part of each side of the chip C, the pads 6a and 6b in the first and second rows are disposed in a mutually staggered manner to together form a zigzag pattern. The separations between mutually adjacent pairs of the pads 61 on each of the rows (first and second) in the center part are slightly larger than the separations $P_2$ between the end pads 62, as shown in FIG. 1, while the separations $P_1$ between mutually adjacent pairs of the center pads 61 in the direction of rows are smaller inside the center part than the separations $P_2$ between mutually adjacent pairs of the end pads 62 on the end parts.

The semiconductor chip as described above is bonded to a frame 1 which may be as shown in FIG. 5, having an island 2 at the center of a rectangular region A and inner leads 5 which extend radially from the center of the island 2, the island 2 being connected to the four corner sections of the region A by suspended leads 3 radially extended from the four corners thereof.

The separations between the bonding pads 6 are determined as follows. Consider corner pads 62 at an end part as shown in FIG. 2. Let $\theta$ denote the angle between a radially extending bonding wire 71 or 72 and the edge of the chip. Let $d_0$ denote the distance of separation required between a mutually adjacent pair of the wires 7 (71 or 72) in order to prevent interference therebetween. Then, the minimum separation between a mutually adjacent pair of pads 6 connected to wires 7 crossing the edge of the chip C at angles $\theta$ is $d_0/\sin\theta$. For the corner pads 62, $\theta$ is about 45°, and the separations therebetween $P_2$ is therefore about $2^{1/2}d_0$. For the center pads 61, $\theta$ is approximately 90°, and the separations therebetween $P_1$ may be reduced to about $d_0$.

In summary, the pitch of the bonding pads 6 according to this invention is not constant but is varied such that the pitch $P_1$ is smaller for the center pads 61 than the pitch $P_2$ for the corner pads 62. This is accomplished, according to the embodiment shown in FIG. 1 and 2, by disposing the center pads 61 in two parallel rows such that they form a zigzag line over the center part. With the pads 6 thus arranged along each of the four sides of the rectangularly shaped chip C, it is possible to carry out correctly the first bonding of the wires and to reduce the size of the chip as compared to prior art chips having pads formed thereon at a constant pitch.

As shown in FIG. 5, the pads 6 on the semiconductor chip C bonded to the island 2 of a frame 1 are each connected to a corresponding one of the inner leads 5 through a bonding wire 7. Thereafter, a resin package 9 is formed as shown in FIG. 4 by sealing the area shown by line B in FIG. 5 with a resin material, and a quad-form semiconductor device is obtained by cutting unwanted portions of the tie bars 4 as well as the outer leads protruding from the frame 1. Since chips according to the present invention are smaller than corresponding prior art chips, the resin-packaged type semiconductor device thus obtained according to this invention is also more compact that corresponding prior art semiconductor devices.

The example described above with reference to FIGS. 1 and 2 are not intended to limit the scope of this invention. Many modifications and variations are possible within the scope of this invention. The pads for bonding on the chip may be arranged, as shown in FIG. 3, in one row on end parts and in two rows on a center part in between, neither of the two rows in the center part being collinear with the rows on the end parts, the separations between mutually adjacent pairs of the pads 61 on each of the rows in the center part being slightly larger than the separations between the end pads 62. Moreover, the pads over the center part do not necessarily have to be arranged in a zigzag. The pads along any of the sides may be arranged all in a straight line, with the separations of their mutually adjacent pairs varied such that they are smaller near the center and larger towards the ends of the line. It is further to be understood that the present invention is applicable also to the type of a semiconductor chip having wire bonding pads arranged only along two mutually parallel sides or only one of its sides. In summary, this invention is applicable to any chip with a plurality of wire bonding pads arranged on at least one of its sides.

What is claimed is:

1. A semiconductor chip comprising:

a planar rectangular surface with four sides, each of said four sides having a center part and end parts which sandwich said center part therebetween; and a plurality of pads adapted for wire bonding arranged on said surface sequentially along at least one of said sides, said sequentially arranged pads along said one side being in a straight line within said end parts at a specified separation, separations along said one side between mutually adjacent pairs of said sequentially arranged pads in the center part being smaller than said specified separation, said sequentially arranged pads within said center part being in a zigzag, alternately on an inner row and an outer row which are both parallel to said one side, separations between mutually adjacent pairs of said pads in said center part on each of said inner and outer rows being larger than said specified separation.

2. A semiconductor device comprising:

a frame having a rectangular planar island at a center and a plurality of inner leads extending radially from said island;

a rectangular chip bonded to said planar island, said chip having a planar rectangular surface with four sides and a plurality of pads adapted for wire bonding arranged on said surface sequentially along at least one of said sides, each of said four sides having a center part and end parts which sandwich said center part therebetween, said sequentially arranged pads along said one side being in a straight line within said end parts at a specified separation, separations along said one side between mutually adjacent pairs of said sequentially arranged pads in the center part being smaller than said specified separation, said sequentially arranged pads within said center part being in a zigzag, alternately on an inner row and an outer row which are both parallel to said one side, separations between mutually adjacent pairs of said pads in said center part on each of said inner and outer rows being larger than said specified separation;

wires each connecting one of said pads on said chip with a corresponding one of said inner leads; and a resin package which seals said chip and said inner leads therein.

* * * * *